United States Patent
Yeh et al.

(10) Patent No.: US 6,709,921 B2
(45) Date of Patent: Mar. 23, 2004

(54) FABRICATION METHOD FOR A FLASH MEMORY DEVICE WITH A SPLIT FLOATING GATE AND A STRUCTURE THEREOF

(75) Inventors: Yen-hung Yeh, Taoyuan Hsien (TW); Tso-Hung Fan, Taipei Hsien (TW); Wen-Jer Tsai, Hualian (TW); Mu-Yi Liu, Hsinchu (TW); Kwang Yang Chan, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 22 days.

(21) Appl. No.: 09/967,717

(22) Filed: Sep. 27, 2001

(65) Prior Publication Data

US 2003/0060010 A1 Mar. 27, 2003

(51) Int. Cl.$^7$ .............................................. H01L 21/336
(52) U.S. Cl. ...................... 438/257; 438/261; 438/265; 438/267
(58) Field of Search ................................ 438/257, 261, 438/265, 595, 304, 588, 302, 525; 257/318, 328, 316

(56) References Cited

U.S. PATENT DOCUMENTS

| | | | | |
|---|---|---|---|---|
| 6,248,633 B1 | * | 6/2001 | Ogura et al. | 438/267 |
| 6,281,545 B1 | * | 8/2001 | Liang et al. | 257/315 |
| 6,297,098 B1 | * | 10/2001 | Lin et al. | 438/364 |
| 6,365,455 B1 | * | 4/2002 | Su et al. | 432/257 |
| 6,480,414 B1 | * | 11/2002 | Lin et al. | 365/185.03 |

* cited by examiner

Primary Examiner—Amir Zarabian
Assistant Examiner—Pamela E Perkins
(74) Attorney, Agent, or Firm—J.C. Patents

(57) ABSTRACT

A fabrication method for a flash memory device with a split floating gate is described. The method provides a substrate, wherein an oxide layer and a patterned sacrificial layer are sequentially formed on the substrate. Ion implantation is then conducted to form source/drain regions with lightly doped source/drain regions in the substrate beside the sides of the patterned sacrificial layer using the patterned sacrificial layer as a mask. Isotropic etching is further conducted to remove a part of the patterned sacrificial layer, followed by forming two conductive spacers on the sidewalls of the patterned sacrificial layer. The patterned sacrificial layer and oxide layer that is exposed by the two conductive spacers are then removed to form two floating gates. Subsequently, a dielectric layer and a control gate are formed on the substrate.

8 Claims, 4 Drawing Sheets

FABRICATION METHOD FOR A FLASH MEMORY DEVICE WITH A SPLIT FLOATING GATE AND A STRUCTURE THEREOF

BACKGROUND OF THE INVENTION

1. Field of Invention

The present invention relates to a method for fabricating a flash memory and a structure thereof. More particularly, the present invention relates to a fabrication method for a split floating gate flash memory and the structure thereof.

2. Description of Related Art

Read-only memory is widely used because it can permanently store information. A few samples of read-only memory include mask ROMs, programmable ROMs (PROM), erasable programmable ROMs (EPROM), electrically erasable programmable ROMs (EEPROM) and flash ROMs.

Among the various types of read-only memory, the erasable programmable read-only memory provides the advantages of being programmable and erasable. Moreover, information are retained in read-only memory even power is interrupted. The erasable programmable read-only memory is thus a popular device for systems, such as the BIOS (the Basic Input/Out operating system) for personal computers and electronic devices that require the capability of data retention and update. Especially for the flash type of read-only memory, not only the feature size of a flash memory is small and the power consumption is low, the flash memory also provides the advantage of an in-circuit electrical programming and electrical erasing. Furthermore, the erasure of information is conducted in a block-by-block manner; the operating speed is thus faster FIG. 1 is a schematic, cross-sectional view of a memory cell of a conventional flash memory device. As shown in FIG. 1, the flash memory device comprises a stacked gate structure, wherein the stacked gate structure, located on a substrate 100, comprises sequentially a tunnel oxide layer 102, a floating gate 104, a dielectric layer 106 and a control gate 108. Moreover, a source region 110 and a drain region 112 are positioned beside the sides of the stacked gate structure in the substrate 100.

The above flash memory device stores 1-bit of data in one cell. In other words, one bit of memory is stored in the floating gate of this memory cell structure. As the integration of memory device gradually increases and the device dimension slowly decreases, the conventional 1-bit data in one cell type of data storage is thus limited by the design rule to forbid a further increase of integration of memory device.

SUMMARY OF THE INVENTION

The present invention provides a fabrication method for a flash memory device with a split floating gate and the structure of such a flash memory. A pair of floating gates is formed in a memory cell, in which two bits of memory are stored in one memory cell. The storage capacity and the integration of the memory device are thus increased.

The present invention provides a fabrication method for a flash memory with a split floating gate, wherein the method provides a substrate. An oxide layer and a patterned sacrificial layer are sequentially formed on the substrate. Thereafter, ion implantation is conducted to form source/drain regions, with lightly doped source/drain regions in the substrate beside the sides of the sacrificial layer, using the patterned sacrificial layer as a mask. Isotropic etching is further conducted to remove a part of the patterned sacrificial layer. Two conductive spacers are formed on the sidewalls of the patterned sacrificial layer. The patterned sacrificial layer and the oxide layer that is exposed by the conductive spacers are removed. Two floating gates are thus formed with the remaining conductive spacers. Thereafter, a dielectric layer and a control gate are sequentially formed on the substrate.

The present invention provides a structure of a flash memory device with a split floating gate, wherein the structure includes a substrate, a source region, a drain region, a tunnel oxide layer, a first floating gate and a second floating gate that are split from each other, a dielectric layer and a control gate. The source region and the drain region are located in the substrate, respectively. The first floating gate is located partly on the source region and partly on the substrate. The second floating gate is located partly on the drain region and partly on the substrate. The tunnel oxide layer is positioned between the floating gates and the source/drain regions. The dielectric layer is placed on the first floating gate, the second floating gate and on the substrate. Additionally, the control gate is placed on the dielectric layer.

The present invention provides a programming method and an erasing method for a flash memory device with a split floating gate, wherein the programming of this type of flash memory device is by the channel hot electron injection method. The erasure of this type of flash memory device is by the negative gate channel erase (NGCE) method.

Accordingly, a pair of floating gates is formed in a memory cell. The programming and the erasure of two bits of data can be performed in one memory cell. The storage capacity for a memory device is thus increased to increase the integration of the memory device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute as a part of this specification. The drawings illustrate embodiments of the invention and, together with the description, serve to explain the principles of the invention. In the drawings.

DESCRIPTION OF THE PREFERRED EMBODIMENTS

FIGS. 2A to 2G are schematic, cross-sectional views showing a fabrication method for a split floating gate flash memory according to a preferred embodiment of the present invention.

Figure 1:
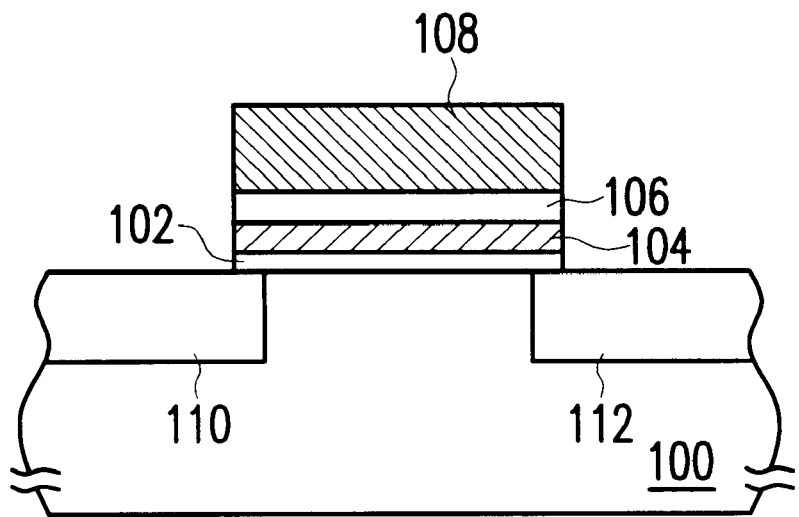
FIG. 1 is a schematic, cross-sectional view showing a conventional flash memory device structure.
Figure 2A:
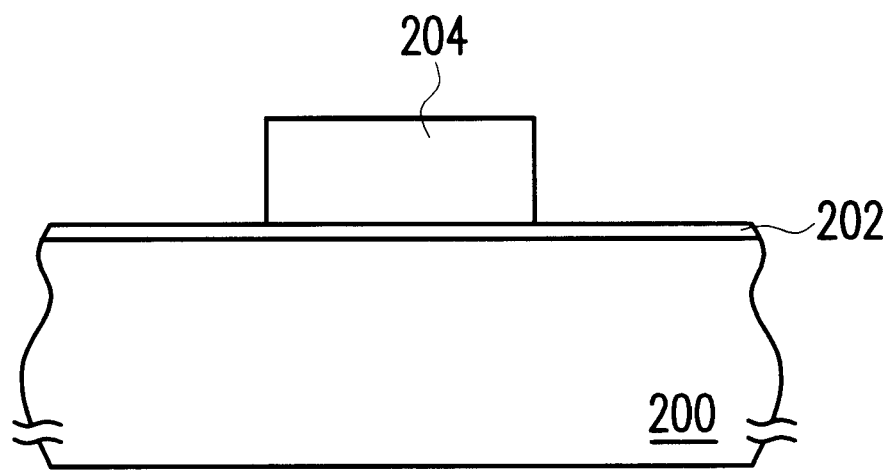
FIGS. 2A to 2G are schematic, cross-sectional views showing a fabrication method for a split floating gate flash memory according to a preferred embodiment of the present invention.

As shown in FIG. 2A, a substrate 200 is provided. An oxide layer 202 is formed on the substrate 200, wherein the oxide layer 202 includes silicon oxide, formed by thermal oxidation. After this, a patterned sacrificial layer 204 is formed on the oxide layer 202. The sacrificial layer 204, such as silicon nitride, is formed by, for example, forming a material layer (not shown in Figure) on the oxide layer 202, followed by photolithography and etching the material layer to form the patterned sacrificial layer 204.

Figure 2B:
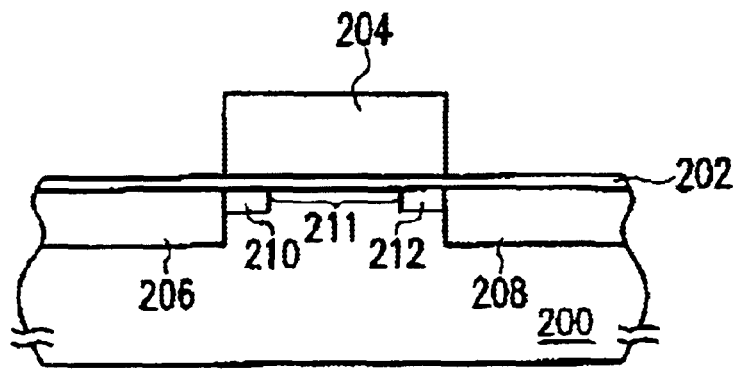

Refer to FIG. 2B, a source region 206 and a drain region 208 are formed in the substrate 200. A channel region 211 is formed in between the source region 206 and the drain region 208. The source region 206 and the drain region 208 are formed by performing ion implantation on the substrate beside the sides of the sacrificial layer 204, using the sacrificial layer 204 as a mask. A lightly doped source region 210 and a lightly doped drain region 212 are then formed in the substrate 200. The lightly doped source region 210 and the lightly doped drain region 212 extend from the source region 206 and the drain region, respectively, to the substrate under the sides of the sacrificial layer 204. The lightly doped source region 210 and the lightly doped drain region 212 are formed by tilt-angle lightly doped ion implantation using the sacrificial layer 204 as a mask, wherein the lightly doped source region 210 and the lightly doped drain region 212 are connected to the source region 206 and the drain region 208, respectively, and are extended to the substrate 200 under the sides of the sacrificial layer 204.

Figure 2C:
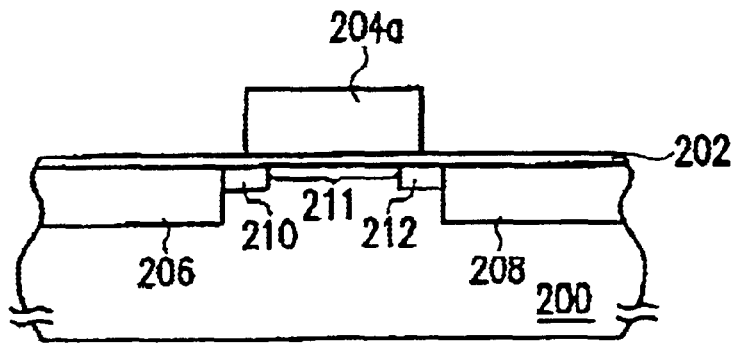

Continue to FIG. 2C, isotropic etching is conducted to remove a part of the sacrificial layer 204 to form a smaller size sacrificial layer 204a. To remove a part of the sacrificial layer 204 is accomplished by, for example, wet etching with hot phosphoric acid. The partial removal of the sacrificial layer 204 is to have the subsequently formed floating gates be partly positioned on the source/drain regions and be partly positioned on the lightly doped source/drain regions.

Figure 2D:
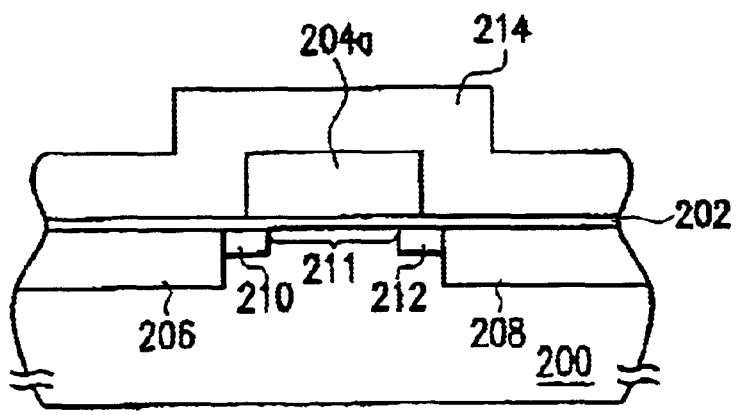

Referring to FIG. 2D, a conformal conductive layer 214 is formed on the substrate 200, wherein the conductive layer 214 includes polysilicon, formed by, for example, chemical vapor deposition.

Figure 2E:
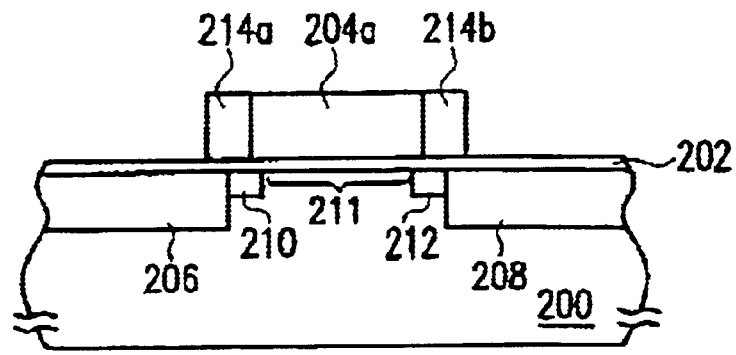

Continuing to FIG. 2E, conductive spacers 214a and 214b are formed on the sides of the sacrificial layer 204a, wherein the conductive spacer 214a is positioned partly over the source region 206 and partly over the lightly doped source region 210. The conductive spacer 214b is positioned partly over the drain region 208 and partly over the lightly doped drain region 212. The conductive spacer 214a and the conductive spacer 214b are formed by anisotropic etching back the conductive layer 214.

Figure 2F:
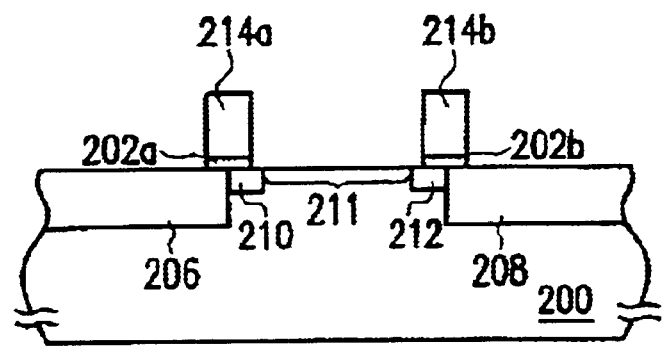

Thereafter, as shown in FIG. 2F, the sacrificial layer 204a is completely removed, wherein the sacrificial layer 204a is removed by wet etching with hot phosphoric acid. The oxide layer 202, exposed by the conductive spacer 214a and the conductive spacer 214b, is then removed. The oxide layer 202 is removed by wet etching using a hydrofluoric acid/buffer oxide etchant (BOE). After the complete removal of the sacrificial layer 204a and the partial removal of the oxide layer 202, the remaining conductive spacers 214a, 214b form the floating gate 214a and the floating gate 214b. The remaining oxide layer thus becomes the tunnel oxide layer 202a and the tunnel oxide layer 202b for the floating gate 214a and the floating gate 214b, respectively.

The floating gate 214a and the floating gate 214b, formed in the step of the isotropic etching a portion of the sacrificial layer 204 as illustrated in FIG. 2C, are positioned partly over the source region 206 and partly over the lightly doped source region 210, and partly over the drain region 208 and partly over the lightly doped drain region 212, respectively. The floating gates 214a and 214b are thereby connected to the lightly doped source region 210 and the lightly doped drain region 212, respectively, to properly control the opening of the channel in order to perform the programming and the erasure operations for the device.

Figure 2G:
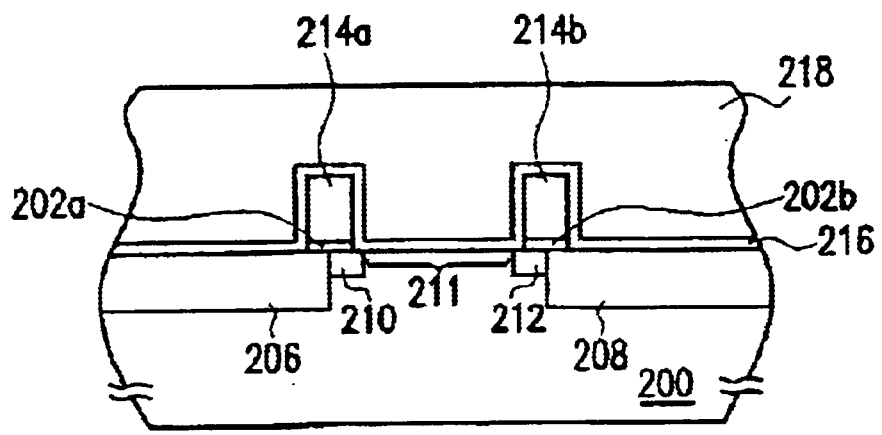

As shown in FIG. 2G, a conformal dielectric layer 216 is formed on the substrate 200, wherein the dielectric layer 216 includes silicon oxide, formed by methods such as chemical vapor deposition. The dielectric layer 216 covers the sidewalls of the floating gates 214a and 214b, which also preferably covers the front portions of the lightly doped source region 210 and the lightly doped drain region 212, which are across from and facing each other. Thereafter, a control gate is formed on the dielectric layer 216, wherein the control gate 218 includes polysilicon, formed by chemical vapor deposition.

The structure of the flash memory with a split floating gate according to the present invention is shown in FIG. 2G.

As shown in FIG. 2G, the flash memory with a split floating gate of the present invention comprises at least a substrate 200, a source region 206, a drain region, a tunnel oxide layer 202a, a tunnel oxide layer 202b, a pair of floating gates 214a, 214b, a dielectric layer 216 and a control gate 218.

The source region 206 and the drain region 208 are located, respectively, in the substrate 200. Moreover, the floating gate 214a is positioned partly over the source region 206 and partly over the substrate 200, and the floating gate 214b is positioned partly over the drain region 208 and partly over the substrate 200. The floating gates 214a and 214b are formed by, for example, polysilicon.

The tunnel oxide layer 202a is located between the floating gate 214a and the source region 206, and the tunnel oxide layer 202b is located between the floating gate 214b and the drain region 208. The tunnel oxide layer 202a and the tunnel oxide layer 202b are, for example, silicon oxide, formed by methods, such as, thermal oxidation.

The dielectric layer 216 is located on and conformal to the floating gate 214a, the floating gate 214b and the substrate 200, wherein the dielectric layer 216 includes silicon oxide, formed by methods, such as, chemical vapor deposition.

The control gate 218 is positioned on the dielectric layer 216, wherein the control gate 218 includes polysilicon, formed by methods, such as, chemical vapor deposition.

The source region 206 further includes the lightly doped source region 210. The lightly doped source region 210 is positioned under the floating gate 214a and is extended to the substrate 200 under the part of the dielectric layer 216 that is on the sidewall of the floating gate 214a, across from and facing the floating gate 214b.

The drain region 208 further includes the lightly doped drain region 212. The lightly doped drain region 212 is positioned under the floating gate 214b and is extended to the substrate 200 under the part of the dielectric layer 216 that is on the sidewall of the floating gates 214b, across from and facing the floating gate 214a.

Figure 3A:
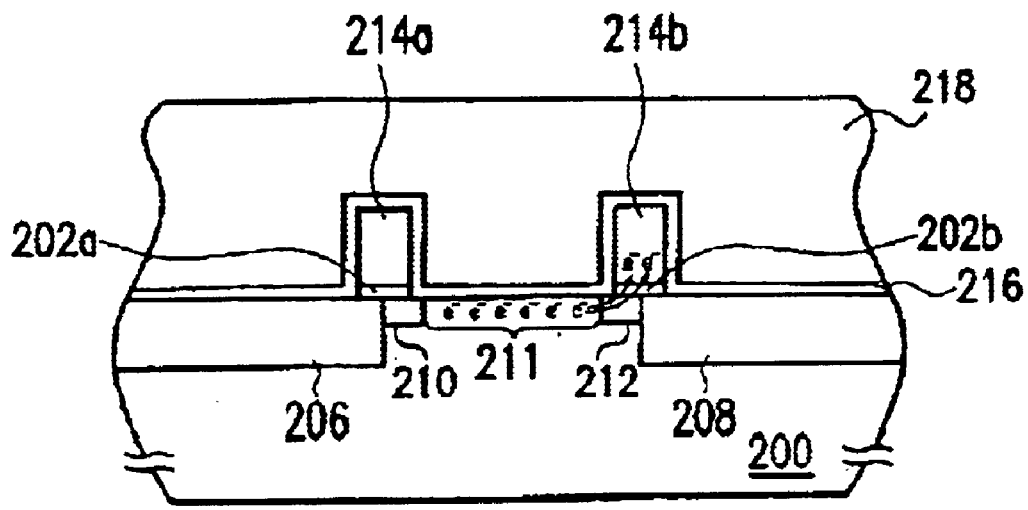
FIG. 3A is a schematic, cross-sectional view, showing the channel hot electron injection method performed by the flash memory device with a split floating gate of the present invention.
Figure 3B:
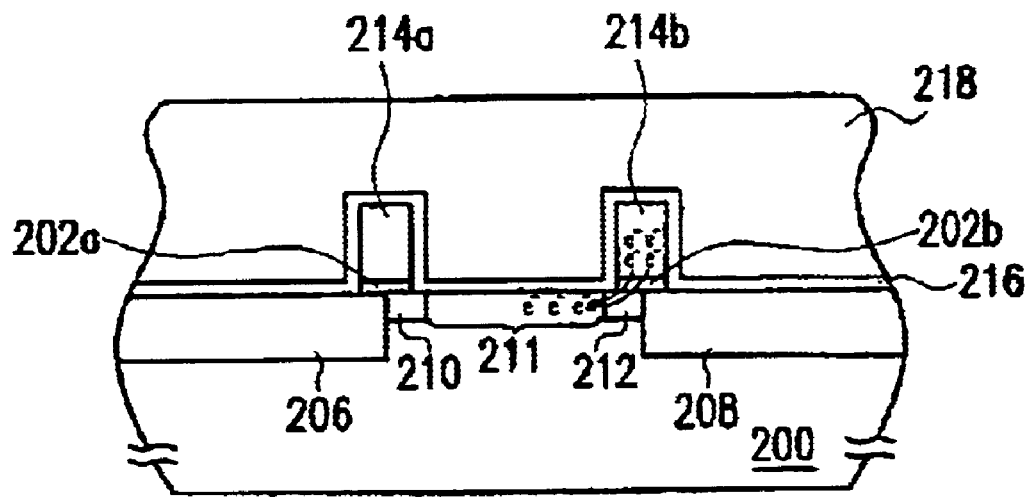
FIG. 3B is a schematic, cross-sectional view, showing the negative gate channel erase method performed by the flash memory device with a split floating gate of the present invention.

The programming and the erasing of data by the flash memory device with a split floating gate of the present invention are illustrated in FIGS. 3A and 3B, respectively.

As shown in FIG. 3A, FIG. 3A is a schematic, cross-sectional view, showing the channel hot electron injection programming method performed by the flash memory device with a split floating gate of the present invention. A positive voltage is applied to the control gate 218 to open up the channel region 211. A voltage is also applied to the drain region 208 to form a bias between the source region 206 and the drain region 208. As the bias between the source region 206 and the drain region 208 becomes very high, an excessive quantity of hot electrons 230 is generated in the channel. A portion of the hot electrons generated in the channel region 211 is then injected into the floating gate 214b through the tunnel oxide layer 202b and is stored in the floating gate 214b to complete the programming operation. The programming operation can also accomplish by performing the channel hot electron injection method to the floating gate 214a or by applying a reversed bias to the source region 206 and the drain region 208.

FIG. 3B is the schematic, cross-sectional view, showing the negative gate channel erase method performed by the flash memory device with a split floating gate of the present invention. A positive voltage is applied to the source region 206 when electrons are stored in the floating gate 214b. A large negative voltage is also applied to the control gate 218. A sufficient voltage difference between the control gate 218 and the source region 206 is thus generated to induce the Fowler-Nordehim tunneling effect. The electrons stored in the floating gate 214b are then injected through the tunnel oxide layer 202b into the channel region 211 to complete the erasure operation. The erasure operation can also accomplish by performing the negative gate drain erase method on the floating gate 214a, or by applying a reversed bias to the source region 206 and the drain region 208.

Accordingly, a pair of floating gates is formed in a memory cell. Two bits of data are thus stored in one cell. In other words, a single memory cell can perform the programming and the erasure of two bits of data. Compare to the conventional memory device that stores 1 bit of data in one cell, the memory device of the present invention increases the data storage capacity and the integration of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory device that comprises a split floating gate, comprising:

providing a substrate;

forming sequentially an oxide layer and a patterned sacrificial layer on the substrate;

performing an ion implantation process on the substrate beside the sides of the sacrificial layer to form source/drain regions that comprise lightly doped source/drain regions using the patterned sacrificial layer as a mask, wherein a channel region is formed in between the source/drain region;

etching a part of the patterned sacrificial layer;

forming two conductive spacers on sidewalls on the etched, patterned sacrificial layer after performing the ion implantation step;

removing the patterned sacrificial layer and a part of the oxide layer that are exposed in between the two conductive spacers to form two floating gates, wherein one of the floating gates is spaced apart from the other floating gate by a space, and wherein the space is located over the channel region and in between the source/drain regions; and forming sequentially a dielectric layer and a control gate on the substrate.

2. The method of claim 1, wherein forming the two conductive spacers further includes:

forming a conductive layer on the substrate; and back-etching the conductive layer to form the conductive spacers on the sidewalls of the patterned sacrificial layer.

3. The method of claim 1, wherein the patterned sacrificial layer includes silicon nitride.

4. The method of claim 1, further includes performing a tilt-angle ion implantation to form the lightly doped source/drain regions.

5. The method of claim 1, wherein etching the part of the patterned sacrificial layer includes using wet etching method.

6. The method of claim 1, wherein the two floating gates are formed partly on the source/drain regions and partly on the lightly doped source/drain regions.

7. The method of claim 1, wherein the dielectric layer, which covers parts of sidewalls of the two floating gates that are across from and facing each other, also covers front portions of the lightly doped source/drain regions.

8. The method of claim 1, wherein the dielectric layer is conformal to the floating gates and the substrate.

\* \* \* \* \*